United States Patent
Lantz et al.

(10) Patent No.: US 7,532,376 B1
(45) Date of Patent: *May 12, 2009

(54) FORMING AN ACTUATING MECHANISM FOR A MICRO-SCANNING DEVICE

(75) Inventors: Mark A. Lantz, Adliswil (CH); Hugo E. Rothuizen, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/194,259

(22) Filed: Aug. 19, 2008

Related U.S. Application Data

(63) Continuation of application No. 11/955,542, filed on Dec. 13, 2007, now Pat. No. 7,440,155.

(51) Int. Cl.
*G02B 26/08* (2006.01)
*H02K 5/00* (2006.01)

(52) U.S. Cl. .................. 359/198; 359/225; 359/900; 310/40 MM

(58) Field of Classification Search ............ None
See application file for complete search history.

(56) References Cited

U.S. PATENT DOCUMENTS

| | | | |
|---|---|---|---|
| 5,009,473 A | 4/1991 | Hunter et al. | |
| 5,834,864 A | 11/1998 | Hestermann et al. | |
| 5,986,381 A | 11/1999 | Hoen et al. | |
| 6,583,524 B2 | 6/2003 | Brandt | |

(Continued)

OTHER PUBLICATIONS

J. Fernando Alfaro and Gary K. Fedder, Actuation for Probe-Based Mass Data Storage, p. 1-4, Carnegie Mellon University, Pittsburgh.

(Continued)

*Primary Examiner*—James Phan
(74) *Attorney, Agent, or Firm*—Cantor Colburn LLP; Martin Toleti

(57) ABSTRACT

Forming an actuating mechanism for a micro-scanning device includes forming a scanner chip having a scan table mounting cavity, first and second coil mounting cavities and first and second pivoting element mounting cavities, positioning a bracket in the scan table mounting cavity, and positioning a scan table in the bracket. A first frame is mounted in the first coil mounting cavity, and a second frame is mounted in the second coil mounting cavity. A first pivoting element is positioned in the first pivoting element mounting cavity. The first pivoting element includes an asymmetrical leverage connection to the first coil and the scan table. In addition, a second pivoting element is connected to the second coil and the scan table, and positioned in the second pivoting element mounting cavity. The second pivoting element includes a symmetric leverage connection or an asymmetric leverage connection to the second coil and the scan table.

4 Claims, 2 Drawing Sheets

U.S. PATENT DOCUMENTS

| | | |
|---|---|---|
| 6,639,313 B1 | 10/2003 | Martin et al. |
| 6,953,985 B2 | 10/2005 | Lin et al. |
| 7,132,721 B2 | 11/2006 | Platt et al. |
| 7,372,025 B2 | 5/2008 | Hoen et al. |
| 2003/0057803 A1 | 3/2003 | Hartwell |
| 2004/0245462 A1 | 12/2004 | Binnig et al. |
| 2007/0268099 A1 | 11/2007 | Jeong et al. |

OTHER PUBLICATIONS

Y. Lu et al., Design, Fabrication and Control of a Micro X-Y Stage with Large Ultra-thin Film Recoding Media Platform, Proceedings of the 2005 IEEE/ASME International Conference on Advanced Intelligent Mechatronics, Jul. 2005, p. 19-24, Monterey.

Mark A. Lantz et al., A Vibration Resistant Nanopositioner for Mobile Parallel-Probe Storage Applications, Journal for Microelectronical Systems, Feb. 2007, p. 130-139, vol. 16, No. 1, IEEE.

FORMING AN ACTUATING MECHANISM FOR A MICRO-SCANNING DEVICE

CROSS REFERENCE TO RELATED APPLICATIONS

This application is a continuation application of U.S. Ser. No. 11/955,542, filed on Dec. 13, 2007, now U.S. Pat. No. 7,440,155, the disclosure of which is incorporated by reference herein in its entirety.

BACKGROUND

This invention relates to the art of probe storage systems and, more particularly, to forming an actuating mechanism for a micro-scanning device portion of a probe storage system.

Parallel probe-based data-storage systems are currently being developed for future data-storage applications. A parallel probe-based system employs a large array of atomic-force microscope probes that read, write and erase data on a storage medium carried by an X/Y scanning system. The large array of probes enables very high storage densities to be achieved. Moreover, by operating the array of probes in parallel, high data transfer rates are also achievable. The high storage capacity combined with rapid transfer rates enables the storage system to be built into a small package that is ideal for mobile storage applications.

Mobile storage applications present a variety of engineering challenges. First, mobile storage systems must be robust against vibration and shock. Second, mobile storage systems must be capable of operating on a restricted power budget. A mobile probe based storage system should be capable of maintaining sub-nanometer tracking performance while being subjected to mechanical shocks that create accelerations approaching 10s of g's. However, making a mechanical device more robust, i.e., capable of withstanding high accelerations, typically requires making components stiffer. By making the components stiffer, power consumption for certain components, e.g., actuators, increases and the device is less desirable for mobile applications.

SUMMARY

Forming an actuating mechanism for a micro-scanning device includes forming a scanner chip having a scan table mounting cavity, first and second coil mounting cavities and first and second pivoting element mounting cavities, positioning a bracket having a first mass in the scan table mounting cavity, and positioning a scan table having a second mass in the bracket. The scan table is selectively moveable relative to the bracket. A first frame is mounted in the first coil mounting cavity, and a second frame is mounted in the second coil mounting cavity. A first coil is positioned in the first frame. The first coil and first frame collectively define a third mass. A second coil is arranged in the second frame. The second coil and the second frame collectively define a fourth mass. A first pivoting element is connected to the first coil and the scan table. The first pivoting element is pivotally positioned in the first pivoting element mounting cavity and pivotally supported about a first pivot point. The first pivoting element includes an asymmetrical leverage connection to the first coil and the scan table. In addition, a second pivoting element is connected to the second coil and the scan table. The second pivoting element is positioned in the second pivoting element mounting cavity and pivotally supported about a second pivot point. The second pivoting element included one of a symmetric leverage connection and an asymmetric leverage connection to the second coil and the scan table. With this arrangement, upon subjecting the scanner chip to acceleration forces, torques generated about the first and second pivot points by inertial forces acting on the first, second, third and fourth masses are substantially balanced in order to isolate the scan table from vibration.

Additional features and advantages are realized through the techniques of exemplary embodiments of the present invention. Other embodiments and aspects of the invention are described in detail herein and are considered a part of the claimed invention. For a better understanding of the invention with advantages and features thereof, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the exemplary embodiments of the invention, together with advantages and features, by way of example with reference to the drawings.

DETAILED DESCRIPTION

Figure 1:
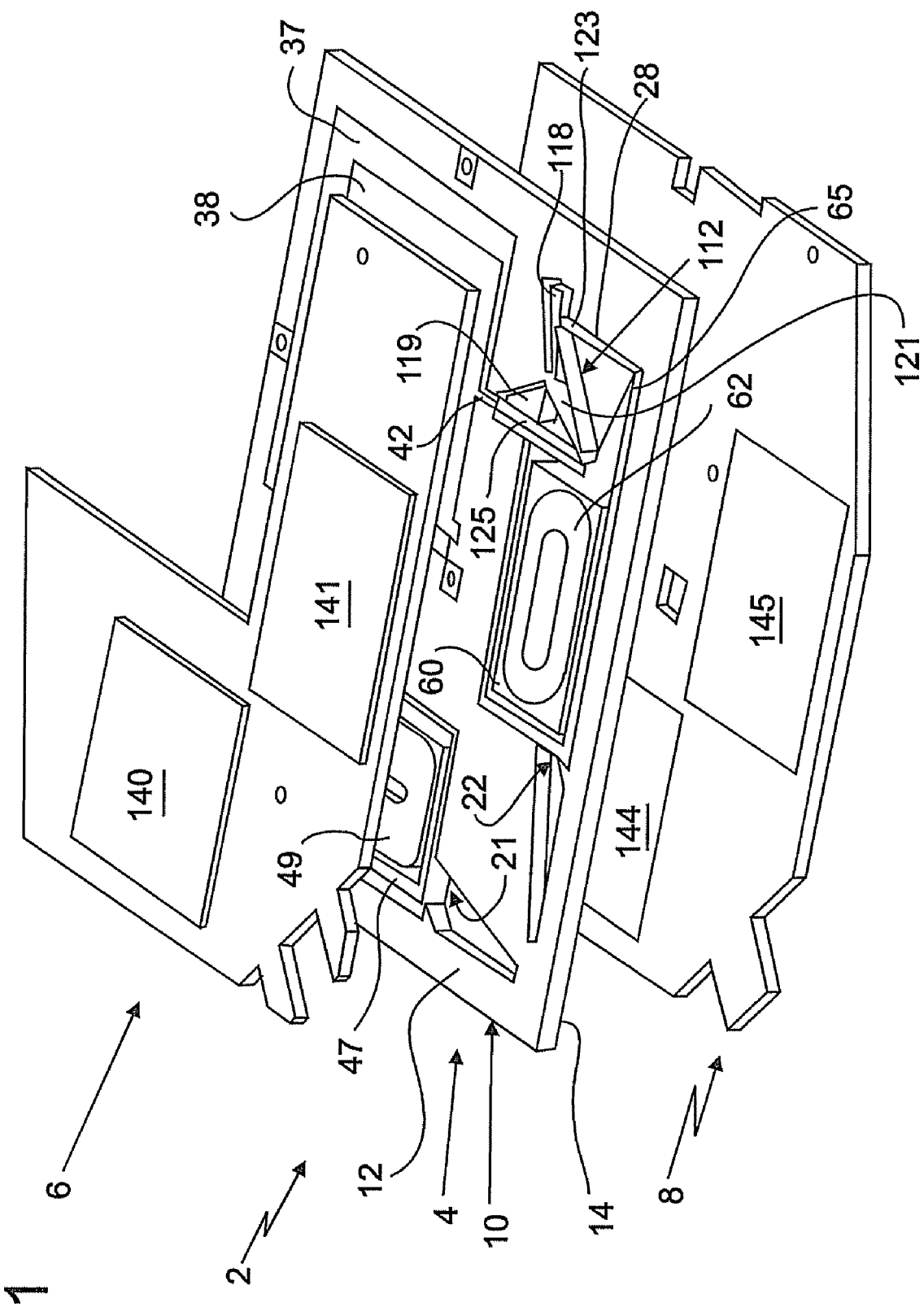
FIG. 1 is an exploded perspective view of an actuating mechanism for a micro-scanning device constructed in accordance with an exemplary embodiment of the present invention.
Figure 2:
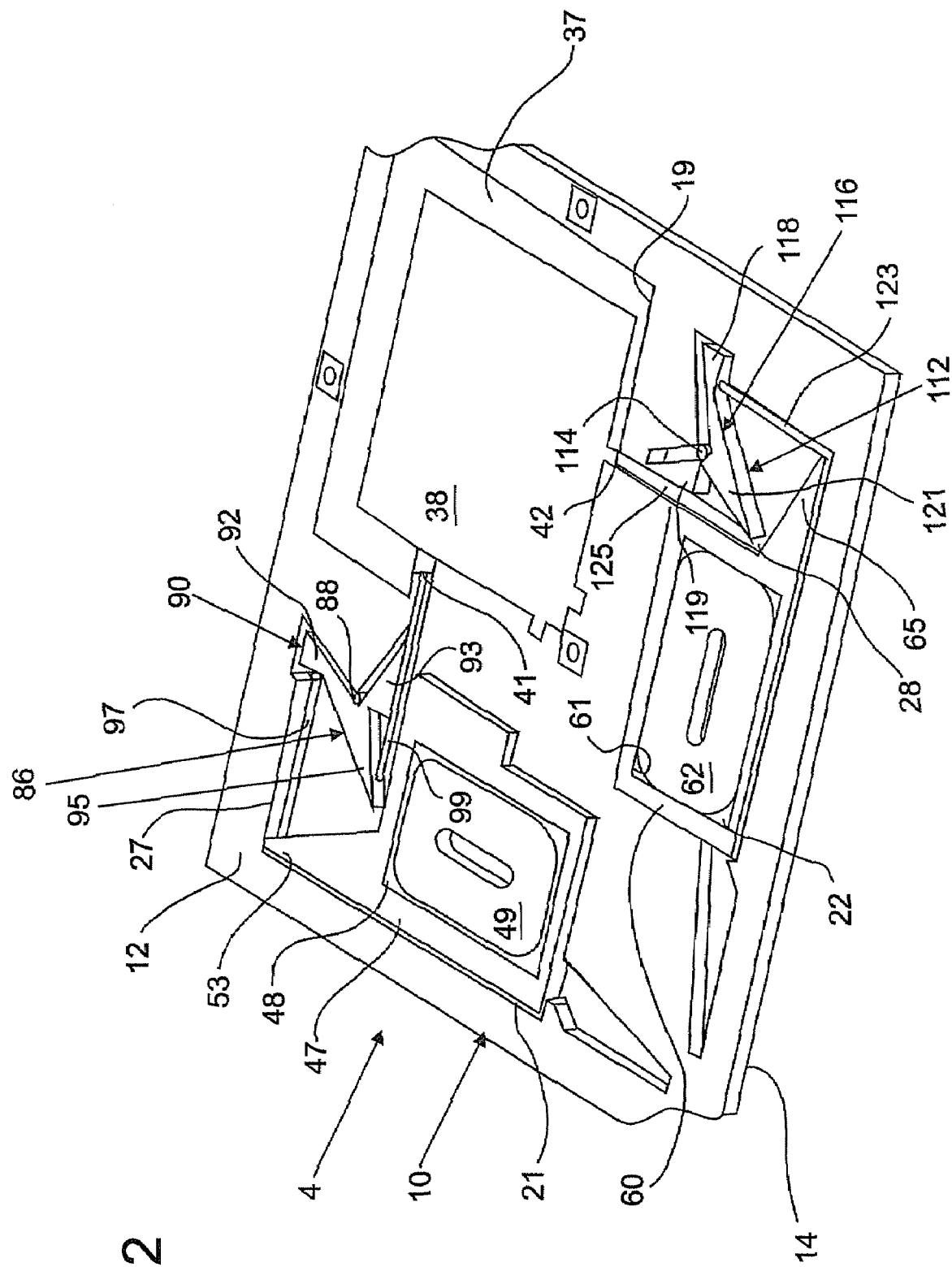
FIG. 2 is a perspective view of a scan chip portion of the actuating mechanism of FIG. 1.

With initial reference to FIGS. 1 and 2 an actuating mechanism, constructed in accordance with an exemplary embodiment of the present invention, is generally indicated at 2. Actuating mechanism 2 includes a scanner chip 4, a first plate 6 and a second plate 8. First and second plates 6 and 8 are spaced from scanner chip 4 a distance of about 20 μm. As shown, scanner chip 4 includes a main body 10 having a first planar surface 12 and an opposing, second planar surface 14 that collectively define a scan table mounting cavity 19, a first coil mounting cavity 21, a second coil mounting cavity 22, a first pivoting element mounting cavity 27, and a second pivoting element mounting cavity 28.

As best shown in FIG. 2, scanner chip 4 includes a bracket 37 and a scan table 38 shiftably mounted within scan table mounting cavity 19. In accordance with the exemplary embodiment shown, bracket 37 has a first mass "m1" and scan table 38 has a second mass "m2" and is about 6.8 mm square. In addition, scan table 38 includes a first connector member 41, and a second connector member 42 which, as will be discussed more fully below, are acted upon to selectively shift scan table 38 along first and second orthogonal axes of an X/Y plane. As also shown in FIG. 2, scanner chip 4 includes a first shuttle or frame 47 shiftably mounted within first coil mounting cavity 21. First frame 47 defines a first coil receiving opening 48 within which is positioned a first coil 49. First frame 47 and first frame 49 collectively define a third mass "m3". Frame 47 includes a connecting arm 53 that, as will become evident more fully below, is operatively connected to scan table 38. Scanner chip 4 also includes a second shuttle or frame 60 shiftably mounted within second coil mounting cavity 22. Second frame 60 defines a second coil receiving opening 61 within which is positioned a second coil 62. Second frame 60 and second coil 62 collectively define a fourth mass "m4". In a manner similar to that described above, second frame 60 includes a connecting arm 65 that is operatively connected to scan table 38. As will also become more fully evident below, first and second frames 47 and 60 are selectively shifted within first and second coil mounting cavities 21 and 22 in order to selectively position scan table 38 in a particular location within a defined X/Y plane.

As further shown in FIG. 2, first frame 47 is operatively connected to scan table 38 through a first pivoting element 86 that is selectively pivotable about a first pivot point 88. First pivoting element 86 includes a main body member 90 having a first element 92, a second element 93 and a third element 95. First pivoting element 86 also includes a first connecting beam 97 that extends from first element 92 and connects with connecting arm 53. First pivoting element 86 also includes a second connecting beam 99 that extends from third element 95 and connects with first connector member 41 provided on scan table 38.

Scanner chip 4 also includes a second pivoting element 112 that operatively interconnects second frame 60 and scan chip 38 and is pivotable about a second pivot point 114. Second pivoting element 112 includes a main body member 116 having a first element 118, a second element 119, and a third element 121. Second pivoting element 112 also includes a first connecting beam 123 that extends from first element 118 and connects to second connecting arm 56, and a second connecting beam 125 that extends from third element 121 and joins with second connecting member 42.

First and second pivoting elements 86 and 112 are selectively shifted about first and second pivot points 88 and 114 respectively through an application of a magnetic motive force. More specifically, first and second magnets 140 and 141 provided on first plate 6, and third and fourth magnets 144 and 145 provided on second plate 8 selectively act upon first and second coils 49 and 62 respectively. That is, magnets 140 and 141 are arranged in first plate 6 so as to act on a first side of first and second coils 49 and 62, while third and fourth magnets 144 and 145 are arranged in plate 8 to act on a second side of first and second coils 49 and 62. With this arrangement, application of electric currents to first and second coils 49 and 62 generates a force that selectively shift first and second frames 47 and 60 along first and second orthogonal axes within respective ones of the first and second coil mounting cavities 21 and 22. As first and second frames 47 and 60 shift, connecting beams 97 and 123 act upon corresponding ones of first and second pivoting elements 86 and 112. Pivoting elements 86 and 112 pivot about corresponding pivot points 88 and 114. As pivoting elements 86 and 112 pivot, first and second connecting beams 99 and 125 selectively position scan table 38 in a predetermined location defined on an X/Y plane. With this arrangement, scan table 38 can move up to 120 µm in orthogonal directions.

First pivoting element 86 includes a center of mass that is substantially coincident with first pivot point 88 and is arranged such that a leverage force exerted by connecting beam 97 about first pivot point 88 is asymmetric relative to a leverage force exerted by connecting beam 91 about first pivot point 88. That is, a distance "x" between first connecting beam 97 and pivot point 88 is different than a distance "y" defined between first pivot point 88 and second connecting beam 99 so as to establish an asymmetrical leverage connection. Conversely, second pivoting element 112 includes a center of mass that is substantially coincident with second pivot point 114 and is arranged such that a leverage force exerted by connecting beam 125 about second pivot point 114 is symmetric relative to a leverage force exerted by connecting beam 123 about second pivot point 114. More specifically, a first distance "w" defined between the first connecting beam 123 and second pivot point 114 is substantially identical to a second distance "z" defined between second connecting beam 125 and second pivot point 114 so as to establish a symmetrical leverage connection. Furthermore, the distances "x" and "y" are established to define a predetermined relationship between m1, m2 and m3. More specifically, distances "x" and "y" are employed such that a sum of m1 and m2 multiplied by distance "y" is substantially equal to m3 multiplied by distance "x". That is, $y(m1+m2)=x(m3)$. In addition, m2, is substantially identical to m4. The use of symmetric and asymmetric pivots creates a mass balancing effect for first and second pivoting elements 86 and 112 that provides vibration rejection by balancing torques acting about first and second pivot points 88 and 114 respectively. That is, upon subjecting the scanner chip 4 to acceleration forces, torques generated about first and second pivot points 88 and 114 by inertial forces acting on first, second, third and fourth masses m1, m2, m3, and m4 are substantially balanced in order to isolate scan table 38 from vibration. Of course, it should be appreciated that both pivots can be asymmetric in accordance with alternative embodiments of the present invention. In any event, mass balancing enables the micro scanning device to withstand mechanical shocks that create high accelerations while maintaining nanometer-level precision for positioning scan table 38.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A method of forming an actuating mechanism for a micro-scanning device comprising:

forming a scanner chip having a scan table mounting cavity, first and second coil mounting cavities and first and second pivoting element mounting cavities;

positioning a bracket having a first mass in the scan table mounting cavity;

positioning a scan table having a second mass in the bracket, the scan table being selectively moveable relative to the bracket;

mounting a first frame in the first coil mounting cavity;

mounting a second frame in the second coil mounting cavity;

positioning a first coil in the first frame, the first coil and first frame collectively defining a third mass;

arranging a second coil in the second frame, the second coil and the second frame collectively defining a fourth mass;

connecting a first pivoting element to the first coil and the scan table, the first pivoting element being pivotally positioned in the first pivoting element mounting cavity and pivotally supported about a first pivot point, the first pivoting element having an asymmetrical leverage connection to the first coil and the scan table; and connecting a second pivoting element to the second coil and the scan table, the second pivoting element being positioned in the second pivoting element mounting cavity and pivotally supported about a second pivot point, the second pivoting element having one of a symmetric leverage connection and an asymmetric leverage connection to the second coil and the scan table, wherein upon subjecting the scanner chip to acceleration forces, torques generated about the first and second pivot points by inertial forces acting on the first, second, third and fourth masses are substantially balanced in order to isolate the scan table from vibration.

2. The method of claim 1, further comprising: creating an asymmetric leverage connection between the second pivoting element and the second coil and the scan table.

3. The method of claim 2, further comprising: positioning a plate over the first and second coil mounting cavities on the scanner chip, the plate including first and second magnets that act upon respective ones of the first and second coils.

4. The method of claim 1, further comprising:
arranging a center of mass of the first pivoting element to substantially coincide with the first pivot point; and
positioning a center of mass of the second pivoting element substantially coincident with the second pivot point.

* * * * *